US010747923B2

(12) United States Patent
Zhang et al.

(10) Patent No.: US 10,747,923 B2
(45) Date of Patent: Aug. 18, 2020

(54) METHODS AND APPARATUS FOR EMULATING POWER LOSS EVENT ON AN INTEGRATED CIRCUIT

(71) Applicant: Intel Corporation, Santa Clara, CA (US)

(72) Inventors: Jing Zhang, Folsom, CA (US); Yan Li, Beijing (CN)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 16/365,032

(22) Filed: Mar. 26, 2019

(65) Prior Publication Data

US 2019/0220559 A1 Jul. 18, 2019

(51) Int. Cl.
*G06F 30/331* (2020.01)
*G01R 31/3177* (2006.01)
*G06F 7/58* (2006.01)
*G06F 30/34* (2020.01)

(52) U.S. Cl.
CPC ....... *G06F 30/331* (2020.01); *G01R 31/3177* (2013.01); *G06F 7/582* (2013.01); *G06F 30/34* (2020.01)

(58) Field of Classification Search
CPC ...... G06F 9/455; G06F 21/76; G06F 2217/64; G06F 17/505; G06F 17/5054; G06F 30/331; H01L 27/0203; G01R 31/2851; G01R 31/317; G01R 31/3183; G01R 31/3177; G01R 30/34; G01R 7/582
USPC ................................................ 716/106, 136
See application file for complete search history.

(56) References Cited

U.S. PATENT DOCUMENTS

| 7,124,157 | B2 | 10/2006 | Ikaka |
| 8,595,683 | B1 | 11/2013 | de Buren et al. |
| 8,839,179 | B2 | 9/2014 | Chang et al. |
| 9,405,877 | B1 | 8/2016 | Raabadran et al. |
| 2002/0116675 | A1* | 8/2002 | Gangl ............ G01R 31/318342 714/732 |
| 2007/0152708 | A1 | 7/2007 | Madurawe et al. |
| 2008/0218316 | A1* | 9/2008 | Marques ................ G06Q 10/00 340/10.52 |
| 2009/0164203 | A1* | 6/2009 | Norman ................ G06F 17/505 703/24 |
| 2009/0319253 | A1 | 12/2009 | Phillips et al. |

(Continued)

*Primary Examiner* — Paul Dinh
(74) *Attorney, Agent, or Firm* — Treyz Law Group, P.C.; Jason Tsai

(57) ABSTRACT

Programmable integrated circuits may be used to perform hardware emulation of an application-specific integrated circuit (ASIC) design. The ASIC design may be loaded onto the programmable integrated circuit as a circuit under test (CUT). During hardware emulation operations, an emulation host may be used to coordinate testing of the CUT on the programmable device. To help emulate a power gating event for the ASIC design, the programmable device may be provided with an encoder at the input of the CUT, a decoder at the output of the CUT, and a pseudorandom number generator (PRNG) that outputs a value for adjusting the encoder and decoder. The value output from the PRNG stays fixed when there is no power loss, but will change to a new value during a power gating event. Operated in this way, the data read out from the CUT after the power gating event is effectively corrupted.

20 Claims, 7 Drawing Sheets

(56) References Cited

U.S. PATENT DOCUMENTS

| | | | |
|---|---|---|---|
| 2014/0109674 A1* | 4/2014 | Gross | G01H 1/14 |
| | | | 73/579 |
| 2016/0117149 A1 | 4/2016 | Caron et al. | |
| 2016/0118142 A1* | 4/2016 | Sugahara | G11C 29/38 |
| | | | 714/719 |
| 2019/0108090 A1* | 4/2019 | Shen | G11C 16/10 |

* cited by examiner

US 10,747,923 B2

METHODS AND APPARATUS FOR EMULATING POWER LOSS EVENT ON AN INTEGRATED CIRCUIT

BACKGROUND

This relates to integrated circuits and more particularly, to methods of using programmable integrated circuits for circuit design emulation purposes.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the computer-aided design tools generate configuration data. The configuration data is then loaded into memory elements to configure the programmable elements on the integrated circuit to perform the desired functions of the custom logic circuit.

In contrast to programmable integrated circuits, application-specific integrated circuits (ASICs) include hardwired circuits that are customized for a particular use rather than for general-purpose use. Since each ASIC is specifically designed for a target application, ASICs are more efficient in terms of performance and area compared to their programmable counterparts (i.e., programmable devices implementing the same target application will exhibit lower performance and larger circuit footprint).

Since ASICs have limited usage compared to general-purpose devices, each iteration of an ASIC design tends to be more costly. While it is possible to simulate an ASIC design entirely in software, it may generally be desirable to simulate the ASIC design on actual hardware before actually taping out the ASIC chip to help ensure that the ASIC design will behave as intended. This hardware simulation process is oftentimes referred to as "hardware emulation" or "ASIC emulation," which involves loading the ASIC design under test on a programmable integrated circuit. Prototyping an ASIC design on a programmable device prior to taping out can help shorten the time to market and reduce cost.

It is within this context that the embodiments described herein arise.

DETAILED DESCRIPTION

Embodiments of the present invention relate to integrated circuits and more particularly, to programmable integrated circuits that can be used for hardware emulation. A programmable integrated circuit may be provided with a non-resettable circuit such as a memory circuit or other sequential logic element, an encoder circuit coupled at the input of the non-resettable circuit, a decoder circuit coupled at the output of the non-resettable circuit, and an associated controller for controlling the encoder and decoder circuits.

To emulate a power loss event, the controller may selectively adjust the encoder and decoder circuits, which effectively alters the value that is read out from the non-resettable circuit. Operated in this way, the programmable circuit is able to properly emulate the behavior of application-specific integrated circuits (ASICs) and detect any hardware-level defects that might arise due to stale values within non-resettable circuits after power loss. In other words, this emulation platform provides an improvement to computer technology by allowing a circuit design prototyping team and/or customers to better emulate their ASIC design and to discover more register-transfer-level or firmware-level type bugs prior to actual ASIC tape-out.

It will be recognized by one skilled in the art, that the present exemplary embodiments may be practiced without some or all of these specific details. In other instances, well-known operations have not been described in detail in order not to unnecessarily obscure the present embodiments.

Integrated circuits such as programmable integrated circuits use programmable memory elements to store configuration data. Such type of programmable integrated circuits are sometimes referred to as programmable logic devices (PLDs) or field-programmable gate arrays (FPGAs). During programming of a programmable integrated circuit device, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

The programmability of such types of devices can be leveraged to help simulate the behavior of a prototype design under test (sometimes referred to herein as a circuit under test or "CUT"). For example, it may be desirable to emulate a trial design for an application-specific integrated circuit (ASIC) on a programmable device prior to tape-out to help debug, tweak, and/or improve on the final design. This process in which a DUT is first tested on a programmable integrated circuit is sometimes referred to as ASIC emulation, ASIC prototyping, or hardware emulation.

Figure 1:
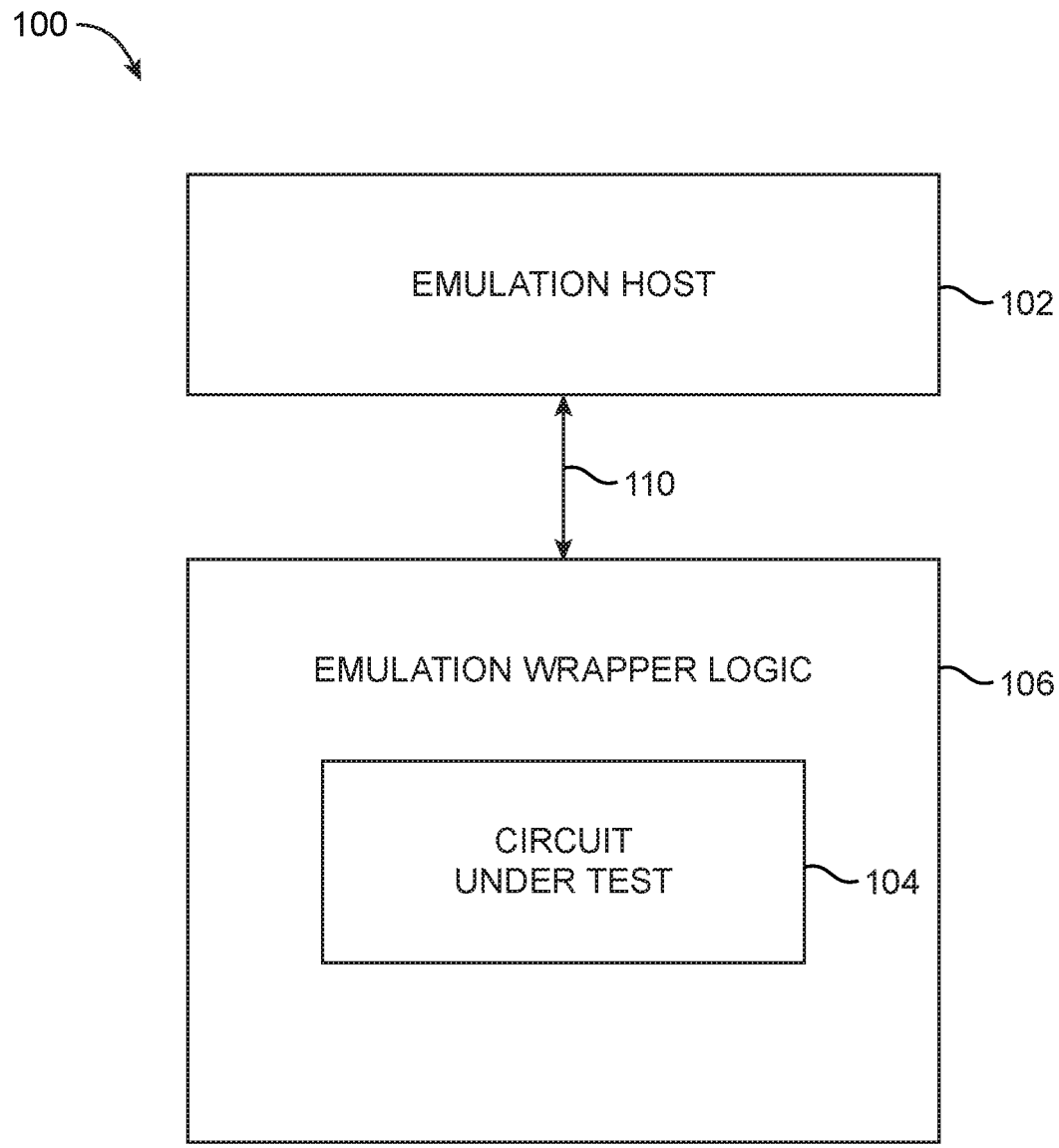
FIG. 1 is a diagram of an illustrative emulation system having an emulation host configured to obtain test results from a circuit under test using associated emulation wrapper logic in accordance with an embodiment.

FIG. 1 is a diagram of an ASIC/hardware emulation system such as system 100. As shown in FIG. 1, ASIC emulation system 100 may include an emulation host such as host 102, which is configured to run tests on a circuit under test (CUT) such as CUT 104. Emulation host 102 may send and receive control and data signals to and from CUT 104 via path 110. CUT 104 may also be coupled to associated emulation control logic such as emulation wrapper logic 106, which is configured to facilitate emulation operations with emulation host 102. At least a portion of circuit under test 104 is configured to implement the ASIC design to be tested. The CUT 104, emulation wrapper logic 106, and/or emulation host 102 may be implemented on a programmable integrated circuit. If desired, emulation host 102 may be implemented as part of an external host computer that is separate from the programmable die. In arrangements where emulation host 102 is implemented within the FPGA die, path 110 may be an intra-die connection. In arrangements where emulation host 102 is implemented external to the FPGA die, path 110 may be an external package-level or system-level interface or computer communications bus.

Figure 2:
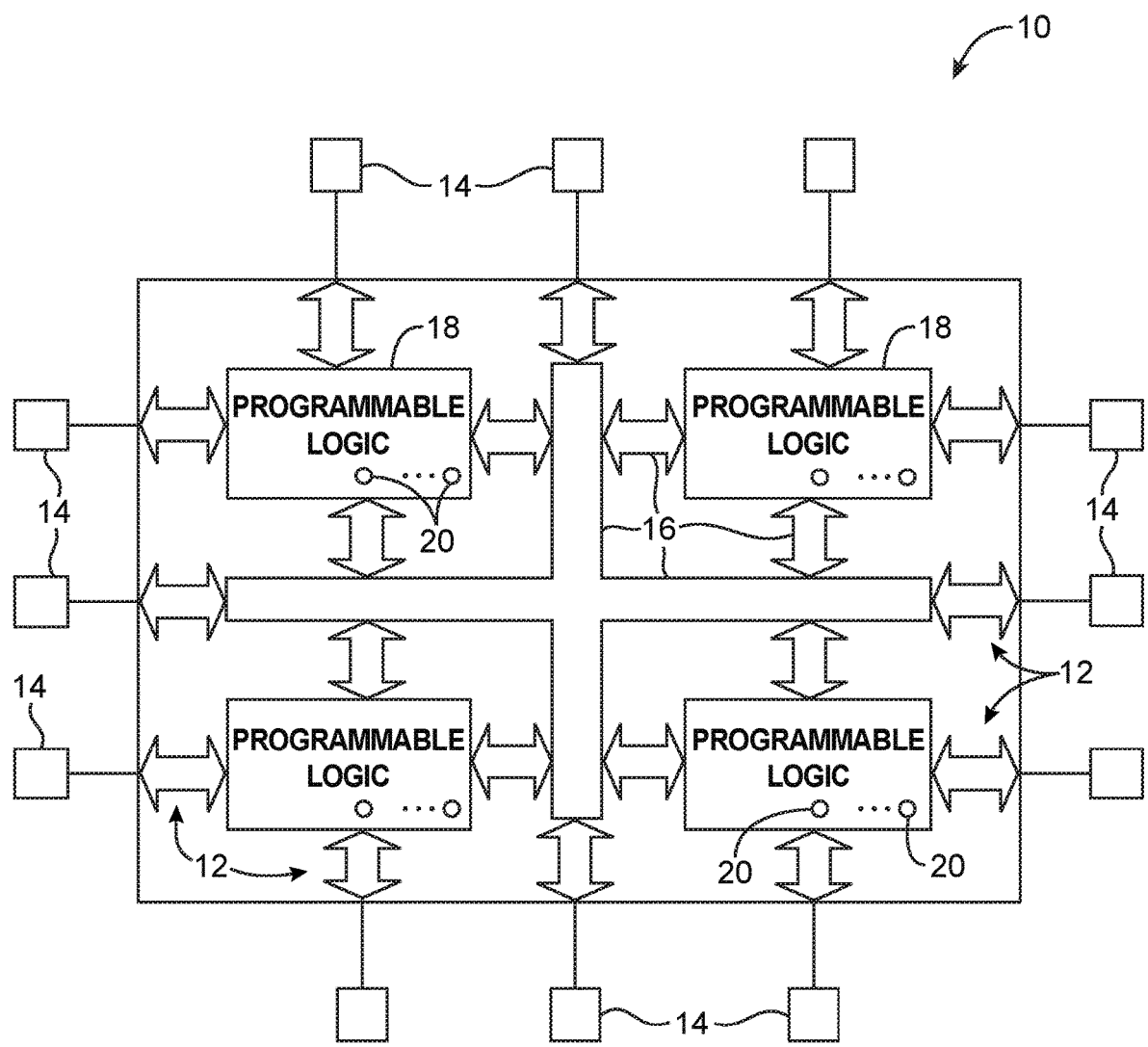
FIG. 2 is a diagram of an illustrative programmable integrated circuit in accordance with an embodiment.

FIG. 2 is a diagram of an illustrative programmable integrated circuit 10 (e.g., an FPGA). As shown in FIG. 2, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically, the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 3:
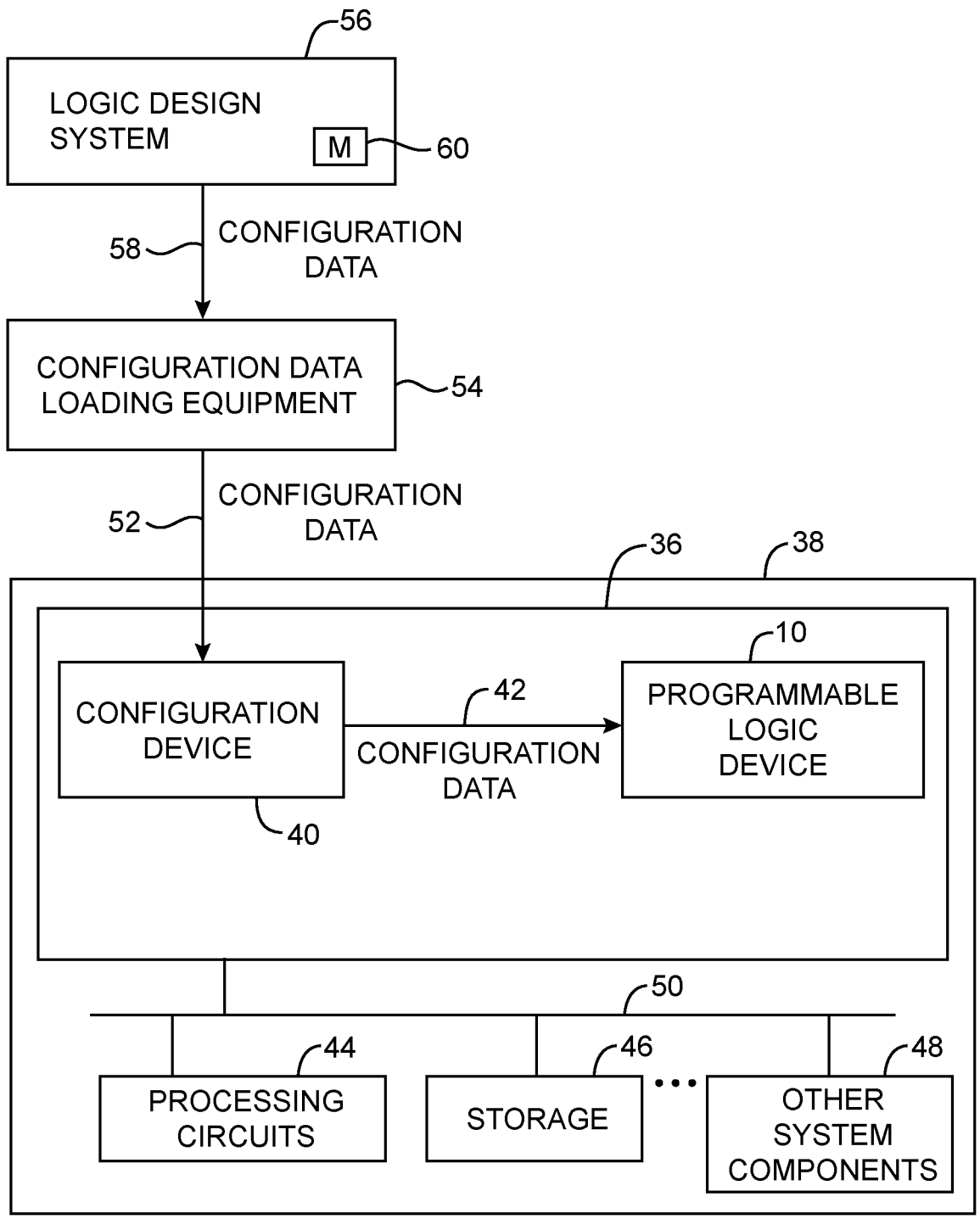
FIG. 3 is a diagram showing how configuration data is created by a logic design system and loaded into a programmable device to configure the device for operation in a system in accordance with an embodiment.

An illustrative system environment for device 10 is shown in FIG. 3. Device 10 may be mounted on a board 36 in a system 38. In general, programmable logic device 10 may receive configuration data from programming equipment or from other suitable equipment or device. In the example of FIG. 3, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 3, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 3.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38. As described above in connection with FIG. 1, at least a portion of device 10 may be configured to implement a circuit under test 104 for ASIC emulation.

Referring back to FIG. 1, in order to fully test CUT 104, it may be desirable to probe or access the internal states of CUT 104. CUT 104 may be operable in (1) a functional mode/phase (e.g., a "normal" mode) during which the circuit design is running normally and (2) an emulation mode/phase (e.g., a "debug" mode) during which the operation is temporarily halted to access the internal states of the CUT. Emulation wrapper logic 106 may be responsible for accessing the internal states of the CUT during the debug mode. Wrapper logic 106 should be functional at all times, either when CUT 104 is running in the functional phase or the emulation phase. Since CUT 104 and wrapper logic 106 coexist in the same core logic fabric of device 10, it may be desirable to access the internal states of CUT 104 without interfering with the operation of wrapper logic 106.

As described above, programmable integrated circuit 10 such as an FPGA may be used to emulate ASIC behavior for prototyping purposes. In contrast to FPGAs, however, ASIC dies oftentimes have multiple power domains. For example, an ASIC die may include a first group of circuits that are powered using a first power supply domain (e.g., using a first power supply voltage signal Vcc1) and a second group of circuits that are powered using a second power supply domain (e.g., using a second power supply voltage signal Vcc2). During operation, the ASIC may power off only one of its multiple power domains (e.g., the first group of circuits may be powered off while the second group of circuits remains actively powered). In such scenarios, when the second group of circuits regains power, all logic elements within the second group of circuits lacking a reset capability will enter a non-deterministic or random state. This behavior is especially true for embedded memory elements such as random-access memory cells, registers, or other types of storage circuits.

Conventionally, FPGAs are not capable of emulating such type of actual power loss for ASICs with multiple power domains. This is because an FPGA prototyping platform only has one power domain. Thus, all logic elements without a reset input would remain in the same state even after emulating a power cycle. This behavior where at least some logic elements retain its prior state following a power loss event is therefore inconsistent with the intended behavior in an ASIC environment where all logic elements without reset is expected to enter some random or different state in response to a power cycling operation. Power loss that occurs when at least a portion of an ASIC is being power cycled is sometimes referred to as a "power gating" event. When power is "gated," no power is currently being supplied to that circuit portion. When the power is "ungated," power is regained and that circuit portion is able to function as intended.

In order to accurately emulate ASIC power gating behavior on a programmable IC based prototyping platform such as that illustrated in FIG. 1, there needs to be a way of corrupting, randomizing, or at least altering the state of certain circuit components within the circuit under test 104 whenever there is an emulated power loss event.

Figure 4:
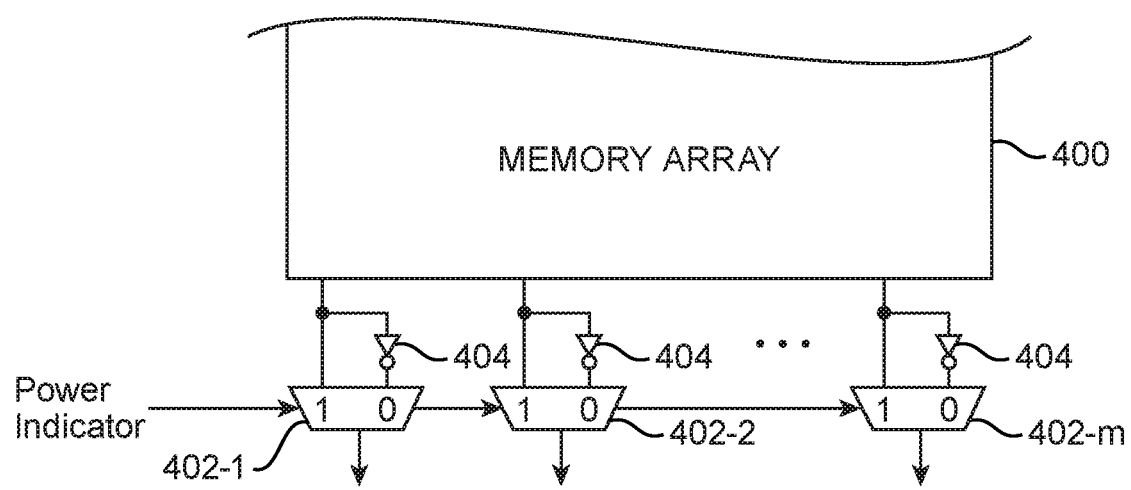
FIG. 4 is a diagram of a memory corruption scheme that only outputs corrupted data during power gating events.

FIG. 4 shows one way of implementing a data corruption scheme for an ASIC memory array 400. As shown in FIG. 4, each column of memory cells in array 400 is coupled to a corresponding multiplexing circuit 402. For instance, a first multiplexer 402-1 has a first input (1) that receives signals from the first column of memory cells and a second input (0) that receives an inverted version of the first column signals via a first inverter 404. A second multiplexer 402-2 has a first input (1) that receives signals from the second column of memory cells and a second input (0) that receives an inverted version of the second column signals via a second inverter 404. Similarly, an $m^{th}$ multiplexer 402-$m$ has a first input (1) that receives signals from the $m^{th}$ column of memory cells and a second input (0) that receives an inverted version of the $m^{th}$ column signals via another inverter 404.

Each of multiplexers 402 is controlled by a power indicator signal. As its same suggests, the power indicator signal reflects whether or not there is a power gating event. During a power gating event, the power indicator signal is set to logic "0", so any data read out from memory array 400 will be inverted. However, at the end of the power gating event when the power is ungated, the power indicator signal is set to logic "1", which restores the original data. In other words, the memory read will return the same value as before the emulated power off state.

Figure 5:
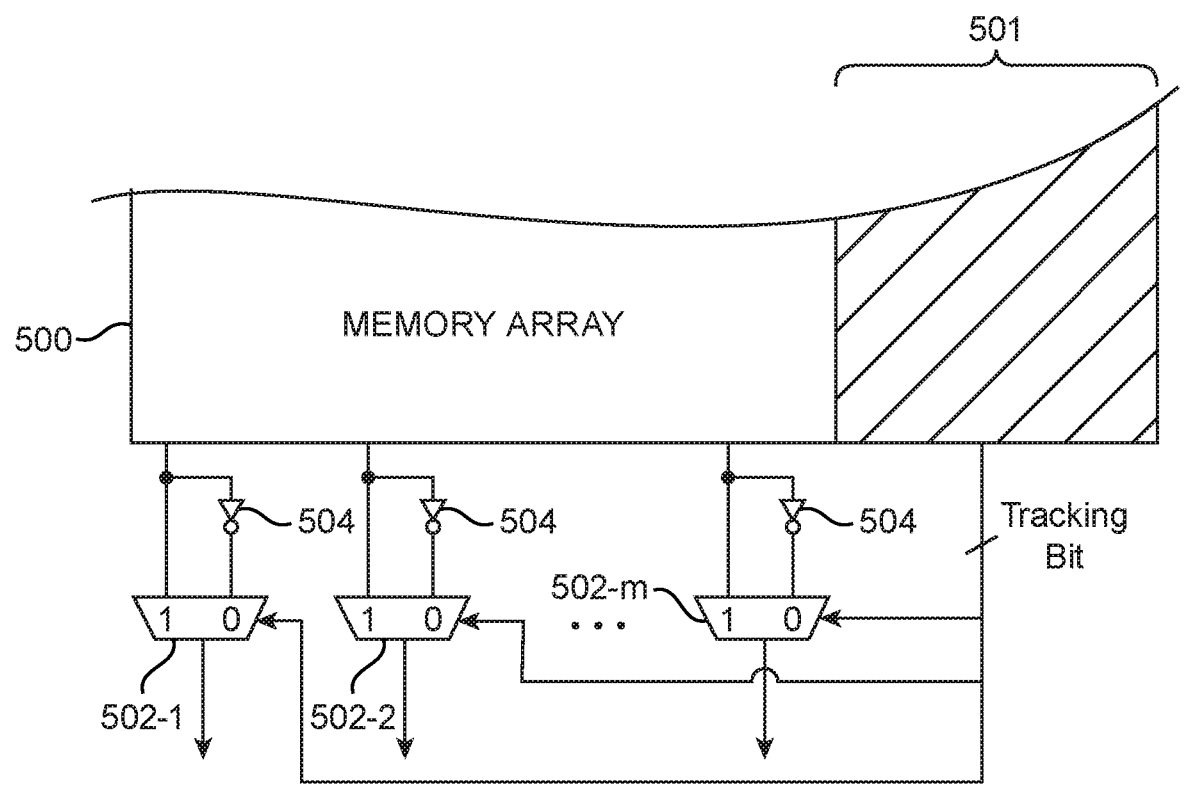
FIG. 5 is a diagram of a memory corruption scheme that uses an additional memory array to track memory write operations and to invert the output data for any entry that has not been written since the last power-up event.

FIG. 5 shows another way of implementing a data corruption scheme for an ASIC memory array 500. As shown in FIG. 5, memory array 500 is provided with a side array 501 for tracking memory write operations for each memory entry. Similar to the arrangement of FIG. 4, each column of memory cells in array 500 is coupled to a corresponding multiplexer circuit 502. For instance, a first multiplexer 502-1 has a first input (1) that receives signals from the first column of memory cells and a second input (0) that receives an inverted version of the first column signals via a first inverter 504. A second multiplexer 502-2 has a first input (1) that receives signals from the second column of memory cells and a second input (0) that receives an inverted version of the second column signals via a second inverter 504. Similarly, an $m^{th}$ multiplexer 502-$m$ has a first input (1) that receives signals from the $m^{th}$ column of memory cells and a second input (0) that receives an inverted version of the $m^{th}$ column signals via another inverter 504.

Unlike the embodiment of FIG. 4, each of multiplexers 502 is controlled by a tracking bit generated by side array 501. The tracking bit will be set to logic "0" for any entry that has not been written since the last power loss, so any data read out from memory array 500 will be inverted. The tracking bit will be set to logic "1" for any entry that has been written since the last power loss, so any data read out from memory array 500 will be the intended read data. This tracking scheme, however, requires a substantial amount of additional resources to implement because it needs at least one bit of storage to track each entry in memory array 500. For an 8-bit wide memory array 500, the total storage space needed to accommodate side array 501 will increase by more than 10%.

In accordance with an embodiment, the FPGA emulation system is provided with a mechanism that effectively changes any prior state information after a power gating event, which offers a much more realistic emulation behavior. Altering or corrupting data content during a power gating event can help software/firmware designers debug any code that depends on stale data prior to the power gating event, thus providing better emulation coverage and can help improve the robustness and performance of the final implemented ASIC-based computing system.

Figure 6:
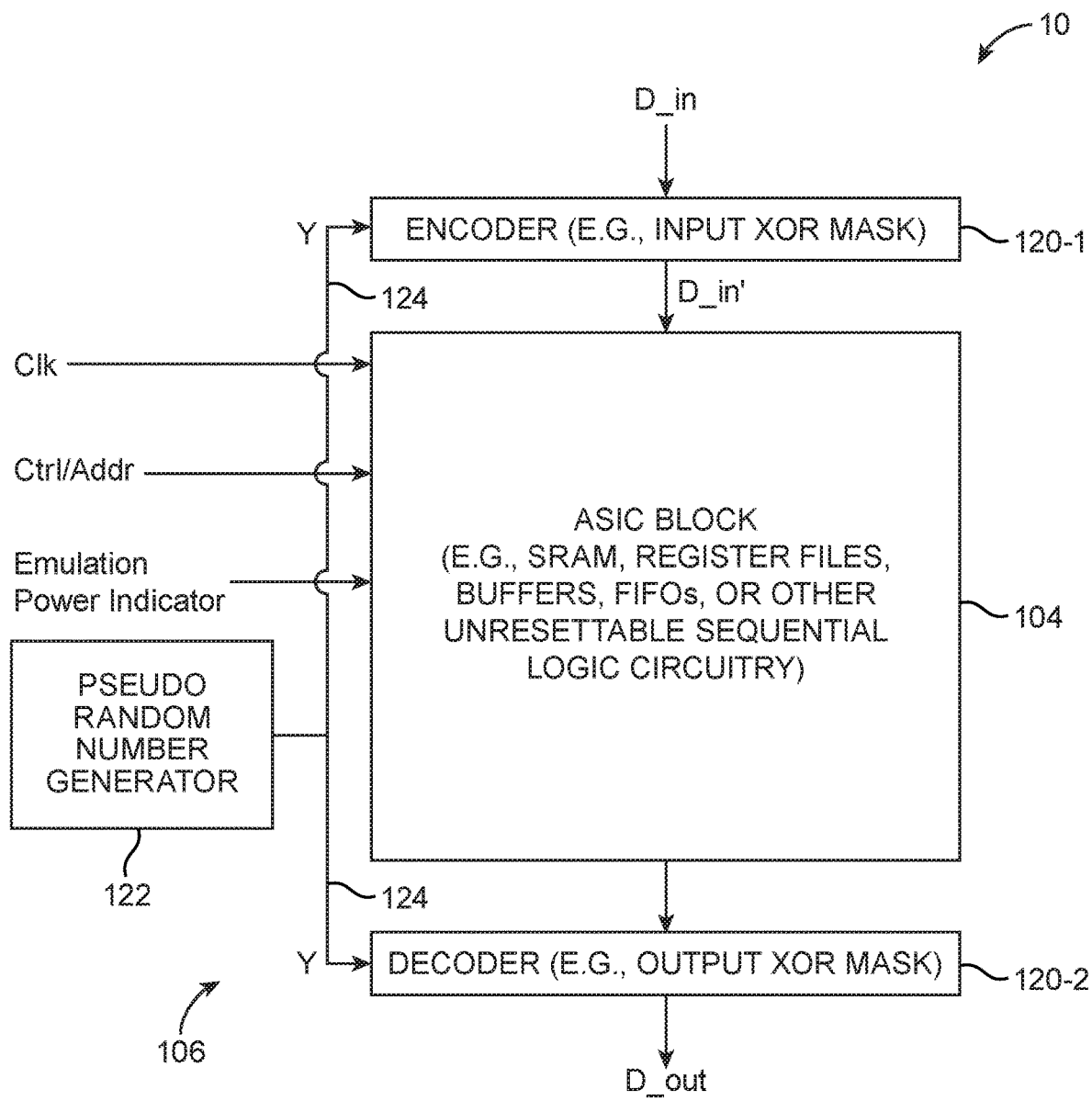
FIG. 6 is a diagram of apparatus configured to support emulation of data content alteration during a power-loss event using an encoder-decoder pair and a pseudo random number generator in accordance with an embodiment.

FIG. 6 is a diagram showing circuitry on a programmable device 10 configured to alter data content on the circuit under test for a more realistic emulation of a power gating event. As shown in FIG. 6, the circuit under test may be any suitable ASIC block under test such as static random-access memory (SRAM), register files, buffers, first-in first-out (FIFO) circuits, or other sequential logic circuits that cannot be reset. The unresettable nature of circuit block 104 gives rise to the need for additional circuitry to corrupt its data content since the content within circuit block 104 would otherwise be retained without a reset operation. During either functional or emulation phases, circuit block 104 may receive a clock (Clk) signal and associated control (Ctrl) and address (Addr) signals from emulation host 102 (see FIG. 1) or other user or control logic within device 10. Device 10 may also be provided with an emulation power indicator for indicating when a power gating even occurs.

The data content alteration mechanism is provided using an encoding circuit such as encoder 120-1 coupled at the input of storage circuit 104, a decoding circuit such as decoder 120-2 coupled at the output of storage circuit 104, and an associated control circuit such as pseudo random number generator (PRNG) 122. Encoder 120-1, decoder 120-2, and PRNG 122 may all be part of emulation wrapper logic 106. Random number generator 122 may generate an output Y (e.g., a multi-bit value) that is simultaneously fed to both encoder 120-1 and decoder 120-2 via path 124.

When power is on (e.g., when the emulation power indicator stays asserted or remains high), the value of random number generator output Y remains fixed. In general, the encoder and decoder circuits may collectively implement a one-to-one reversible operation which is controlled by the value of Y. For example, encoder 120-1 that receives input data D_in may in turn generate corresponding encoded data D_in', which can then be loaded into storage circuit 104. As long as Y remains fixed, any data that is read out from storage circuit 104 and decoded by decoder 120-2 will return the original input data value (i.e., output data D_out will be equal to the original D_in).

When the power is off (e.g., when the emulation power indicator is deasserted or driven low), the value of random number generator output Y is allowed to change. For example, random number generator 122 will change the value of output Y at every rising clock edge of signal Clk. Changing the value of Y will simultaneously alter the way in which circuits 120-1 and 120-2 encodes and decodes. Thus, any data that is subsequently read out via decoder 120-2 will be decoded in a different manner, which effectively corrupts the contents of storage circuit 104. Note that the data stored within the storage circuit 104 is not overwritten and does not actually change. The data is effectively "corrupted" by changing Y to a new value. Random number generator 122 may be implemented using linear feedback shift registers or other ways of implementing random or pseudorandom (which is not truly random) bit generation. Alternatively, controller 122 may be implemented using a counter circuit or other toggling circuits that are capable of generating new deterministic or non-deterministic control values.

Altering data content within ASIC block under test 104 in this way is a very low cost implementation, incurring almost no additional gate count and no timing impact at all. For example, a 256 kilobit memory array in an 8 k by 32 bit configuration requires only 32 registers for implementing the pseudorandom number generator 122 and 64 lookup table (LUT) circuits for implementing the encoder and decoder circuits.

Figure 7:
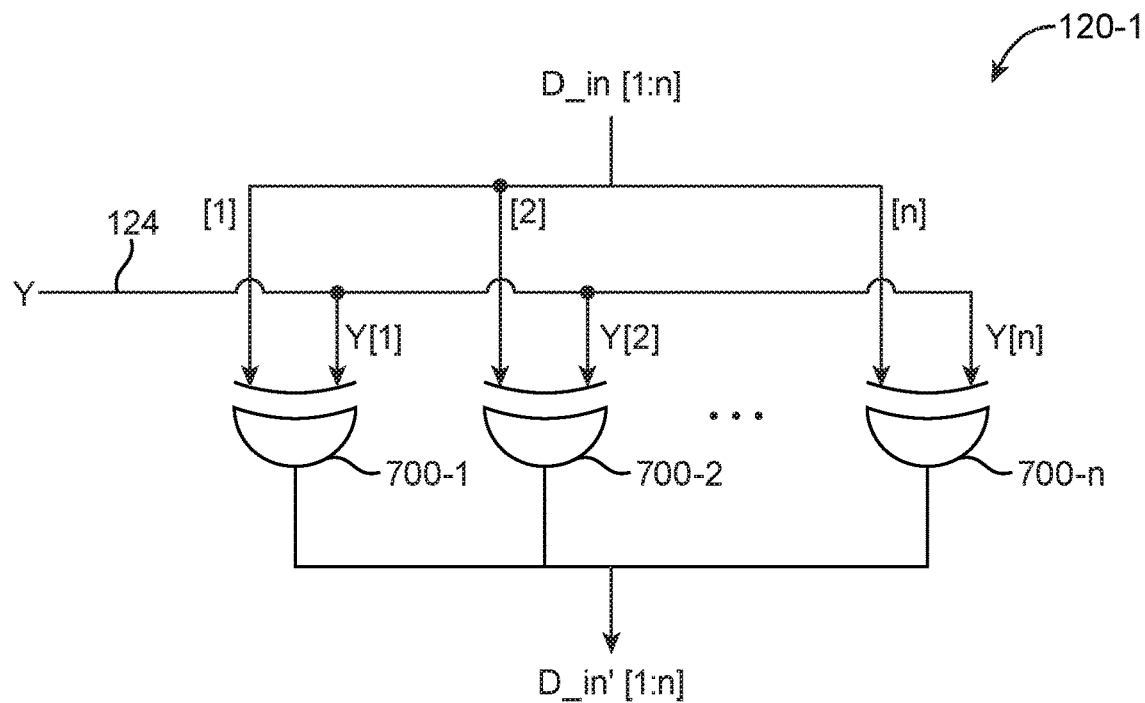
FIG. 7 is a diagram of an illustrative exclusive-OR mask in accordance with an embodiment.

As described above, decoder 120-2 can be any output circuit that reverses the operation of encoder 120-1. FIG. 7 shows how encoder 120-1 may be implemented as an exclusive-OR (XOR) masking circuit. As shown in FIG. 7, the XOR mask may include n XOR gates 700, where n is equal to the bit width of the input data signal. A first XOR gate 700-1 has a first input that receives a first data bit D_in[1] and a second input that receives Y[1] via path 124; a second XOR gate 700-2 has a first input that receives a second data bit D_in[2] and a second input that receives Y[2] via path 124; . . . ; and an $n^{th}$ XOR gate 700-$n$ has a first input that receives last data bit D_in[n] and a second input that receives Y[n] via path 124. The output of the n XOR gates can then be combined to form the encoded output signal D_in'.

If encoder 120-1 is implemented as the XOR mask of FIG. 7, decoder 120-2 may also be implemented as an XOR mask having the identical circuit structure. Since both the encoder XOR mask (sometimes referred to as the input XOR mask) and the decoder XOR mask (sometimes referred to as the output XOR mask) are configured to receive the same random number generator output Y, the two XOR masks are identical. This encoding/decoding scheme works because $XOR(XOR(Y_k,D_k),Y_k)$ will return $D_k$ so long as $Y_k$ remains fixed (where "k" represents the $k^{th}$ bit), which is true while the emulation power indicator is asserted. However, during a power gating event, $Y_k$ will change to a new value $Y_k'$, which effectively corrupts the output of the decoder mask such that the output will no longer return $D_k$.

Figure 8:
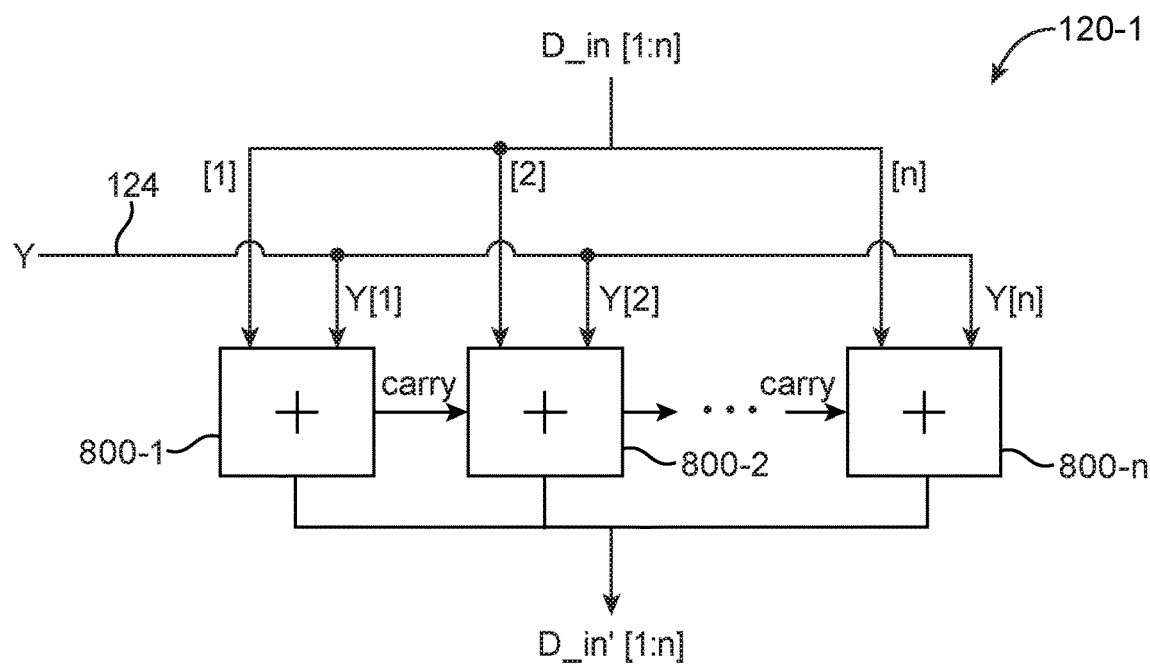
FIG. 8 is a diagram of an illustrative adder mask in accordance with an embodiment.

FIG. 8 illustrates another suitable embodiment where encoder 120-1 may be implemented as an adder masking circuit. As shown in FIG. 8, the adder mask may include an n-bit adder circuit having n adders, where n is equal to the bit width of the input data signal. A first adder 800-1 has a first input that receives a first data bit D_in[1] and a second input that receives Y[1] via path 124; a second adder 800-2 has a first input that receives a second data bit D_in[2] and a second input that receives Y[2] via path 124; . . . ; and an $n^{th}$ adder 800-$n$ has a first input that receives last data bit D_in[n] and a second input that receives Y[n] via path 124. Each adder 800 may have a carry output that is fed to the carry input of the subsequent adder in the chain. The carry input of the first adder 800-1 is zero, whereas the carry output of the final adder 800-$n$ may be ignored. The output of the n adders can then be combined to form the encoded output signal D_in'.

If encoder 120-1 is implemented as the adder mask of FIG. 8, decoder 120-2 may then be implemented as a complementary subtractor mask having a similar circuit structure, except each adder 800 is replaced by an n-bit subtraction circuit. Arranged in this way, the encoder adder mask is configured to add Y to the input data signal, whereas the decoder subtractor mask is configured to subtract Y from the retrieved data prior to reading out. This encoding/decoding scheme works because D+Y−Y will return D so long as Y remains fixed, which is true if the emulation power indicator stays asserted. However, during emulation of a power loss event, Y will change to a new value Y', which effectively corrupts the output of the decoder mask such that the output will no longer return D (i.e., D+Y−Y'≠D). Alternatively, the encoder may implement a subtraction mask, whereas the decoder implements an adder mask. Both encoder and decoder masks (whether or not an addition or subtraction operation is used) may be referred to generically as an adder mask.

The example of FIG. 7 in which the emulation encoder-decoder pair is implemented using XOR masks and the example of FIG. 8 in which the emulation encoder-decoder pair is implemented using adder/subtractor masks are merely illustrative and are not intended to limit the scope of the present embodiments. In general, encoder-decoder pair associated with ASIC CUT 104 may instead implement a bit scrambling algorithm, a multiplication/division algorithm, a modulo-arithmetic algorithm, a hashing algorithm, or other suitable reversible process so long as the same data can be read out absence any power loss while data is corrupted or at least altered upon readout after a power gating event.

Figure 9:
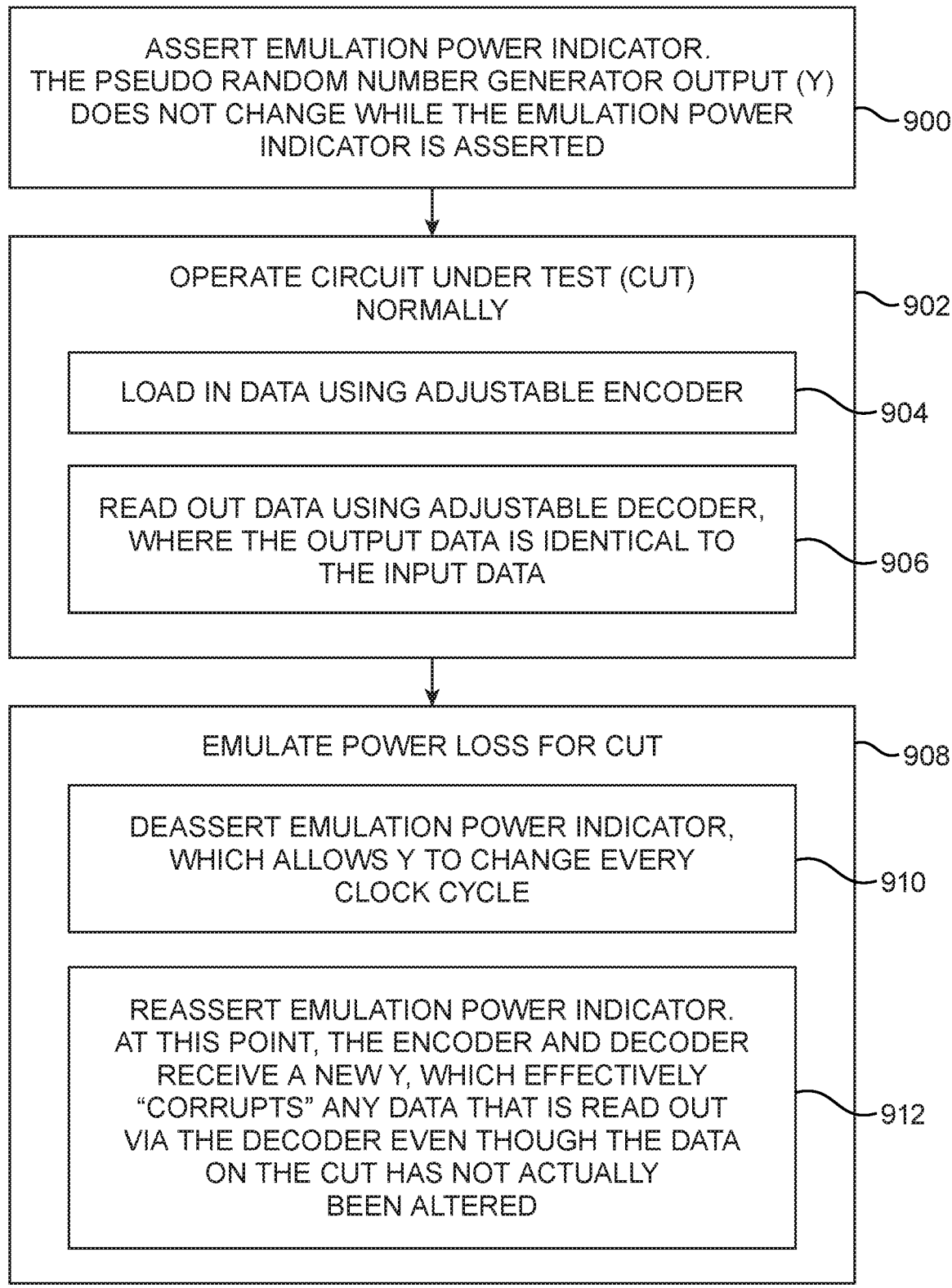
FIG. 9 is a flow chart of illustrative steps for using an integrated circuit to perform emulation operations in accordance with an embodiment.

FIG. 9 is a flow chart of illustrative steps for using the circuitry of FIG. 6 to perform ASIC emulation operations. At step 900, the emulation power indicator signal may be asserted (either by the emulation host or some other controller within device 10). While the emulation power indicator is asserted, the pseudorandom number generator output Y does not change. Thus, the encoder and decoder configurations stay put (at least temporarily).

At step 902, the circuit under test 104 (e.g., an ASIC block such as an SRAM circuit, a register file, a buffer circuit, a FIFO circuit, or other nonresettable sequential logic circuitry) may be placed in normal operation. During normal operation, data may be loaded into CUT 104 via adjustable encoder 120-1 (step 904). Data can then be read out via adjustable decoder 120-2. The data that is read out should be identical to the original input data since Y has not changed.

At step 908, a power loss or power gating event may be emulated for CUT 104. To emulate the power gating, the emulation power indicator signal may be deasserted (step 910), which allows the random number generator output Y to change at least once per clock cycle. Changing Y to some other value will effectively cause both encoder 120-1 and decoder 120-2 to be adjusted from its prior configuration. At step 912 (i.e., when the power is ungated), the emulation power indicator is reasserted. At this point, encoder 120-1 and decoder 120-2 will receive a new Y, which effectively corrupts or alters any data that is read out via the decoder even if the data stored on the CUT has not actually changed.

Operated in this way, the encoder and decoder circuits can be implemented fairly cheaply (e.g., using identical XOR masks, using adder/subtraction masks, using reversible bit scrambling masks, etc.) to perform the desired data corruption or randomization to properly emulate the loss of data that actually occurs during a power-off state on an ASIC circuit design.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

EXAMPLES

The following examples pertain to further embodiments.

Example 1 is an integrated circuit, comprising: a circuit under test configured to emulate at least a portion of an application-specific integrated circuit (ASIC) design; and a decoder circuit configured to receive data signals from the circuit under test, wherein the decoder circuit is configured to decode the received data signals in a first manner prior to an emulated power loss event and is further configured to decode the received data signals in a second manner that is different than the first manner after the emulated power loss event.

Example 2 is the integrated circuit of example 1, optionally further comprising a control circuit configured to adjust the decoder circuit during the emulated power loss event.

Example 3 is the integrated circuit of example 2, wherein the control circuit optionally comprises a pseudo random number generator configured to output a value for adjusting the decoder circuit.

Example 4 is the integrated circuit of any one of examples 2-3, optionally further comprising an encoder circuit configured to receive input data signals and to output corresponding encoded data signals to the circuit under test.

Example 5 is the integrated circuit of example 4, wherein the control circuit is optionally further configured to adjust the encoder circuit.

Example 6 is the integrated circuit of any one of examples 4-5, wherein the decoder circuit and encoder circuit optionally have identical circuit structures.

Example 7 is the integrated circuit of any one of examples 4-6, wherein the decoder circuit and the encoder circuit optionally comprise exclusive-OR masks.

Example 8 is the integrated circuit of any one of examples 4-7, wherein the decoder circuit and the encoder circuit optionally comprise adder masks.

Example 9 is the integrated circuit of any one of examples 2-8, wherein the control circuit optionally receives an emulation power indicator signal that is only deasserted during the emulated power loss event and is otherwise asserted.

Example 10 is the integrated circuit of any one of examples 1-9, wherein the circuit under test optionally comprises a storage circuit.

Example 11 is the integrated circuit of any one of examples 1-10, wherein the circuit under test optionally comprises a nonresettable logic circuit.

Example 12 is a method for operating an integrated circuit, comprising: using a circuit under test to emulate at least a portion of an application-specific integrated circuit (ASIC) design; and with a decoder circuit, receiving data signals from the circuit under test, decoding the received data signals in a first way prior to an emulated power gating event, and decoding the received data signals in a second way that is different than the first way after the emulated power gating event.

Example 13 is the method of example 12, optionally further comprising: with an encoder circuit, receiving input data signals and outputting corresponding encoded data signals to the circuit under test, wherein the encoder circuit encodes the input data signals in a third way prior to the emulated power gating event but encodes the input data signals in a fourth way that is different than the third way after the emulated power gating event.

Example 14 is the method of example 13, optionally further comprising: with a controller, adjusting the decoder circuit and the encoder circuit simultaneously during the emulated power gating event.

Example 15 is the method of example 14, wherein the controller optionally comprises either a counter or a pseudorandom number generator.

Example 16 is a circuit emulation system, optionally comprising: unresettable circuitry under test; an encoder coupled at an input of the unresettable circuitry under test, wherein the encoder is configured to load input data into the unresettable circuitry under test; and a decoder coupled at an output of the unresettable circuitry under test, wherein the decoder is configured to output the original input data before an emulated power loss and is further configured to effectively corrupt data signals upon readout after the emulated power loss, and wherein the corrupted data signals is not equal to the original input data.

Example 17 is the circuit emulation system of example 16, optionally further comprising a pseudorandom number generator for adjusting the encoder and decoder.

Example 18 is the circuit emulation system of any one of examples 16-17, wherein the unresettable circuitry under test optionally comprises a storage circuit selected from the group consisting of: static random-access memory (SRAM), register files, buffers, and first-in first-out (FIFO) circuits.

Example 19 is the circuit emulation system of any one of examples 16-18, wherein the encoder and decoder are optionally implemented using a plurality of logic exclusive-OR (XOR) gates.

Example 20 is the circuit emulation system of any one of examples 16-19, wherein the decoder is optionally further configured to corrupt the data signals upon readout even after power has been regained following the emulated power loss.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
 a circuit under test configured to emulate at least a portion of an application-specific integrated circuit (ASIC) design; and
 a decoder circuit configured to receive data signals from the circuit under test, wherein the decoder circuit is configured to decode the received data signals in a first manner prior to an emulated power loss event and is further configured to corrupt the received data signals by decoding the received data signals in a second manner that is different than the first manner after the emulated power loss event.

2. The integrated circuit of claim 1, further comprising a control circuit configured to adjust the decoder circuit during the emulated power loss event.

3. The integrated circuit of claim 2, wherein the control circuit comprises a pseudo random number generator configured to output a value for adjusting the decoder circuit.

4. The integrated circuit of claim 2, further comprising an encoder circuit configured to receive input data signals and to output corresponding encoded data signals to the circuit under test.

5. The integrated circuit of claim 4, wherein the control circuit is further configured to adjust the encoder circuit.

6. The integrated circuit of claim 4, wherein the decoder circuit and encoder circuit have identical circuit structures.

7. The integrated circuit of claim 4, wherein the decoder circuit and the encoder circuit comprise exclusive-OR masks.

8. The integrated circuit of claim 4, wherein the decoder circuit and the encoder circuit comprise adder masks.

9. The integrated circuit of claim 2, wherein the control circuit receives an emulation power indicator signal that is only deasserted during the emulated power loss event and is otherwise asserted.

10. The integrated circuit of claim 1, wherein the circuit under test comprises a storage circuit.

11. The integrated circuit of claim 1, wherein the circuit under test comprises a nonresettable logic circuit.

12. A method for operating an integrated circuit, comprising:
 using a circuit under test to emulate at least a portion of an application-specific integrated circuit (ASIC) design; and
 with a decoder circuit, receiving data signals from the circuit under test, decoding the received data signals in a first way prior to an emulated power gating event, and corrupting the received data signals by decoding the received data signals in a second way that is different than the first way after the emulated power gating event.

13. The method of claim 12, further comprising:
 with an encoder circuit, receiving input data signals and outputting corresponding encoded data signals to the circuit under test, wherein the encoder circuit encodes the input data signals in a third way prior to the emulated power gating event but encodes the input data signals in a fourth way that is different than the third way after the emulated power gating event.

14. The method of claim 13, further comprising:
 with a controller, adjusting the decoder circuit and the encoder circuit simultaneously during the emulated power gating event.

15. The method of claim 14, wherein the controller comprises either a counter or a pseudorandom number generator.

16. A circuit emulation system, comprising:
 unresettable circuitry under test;
 an encoder coupled at an input of the unresettable circuitry under test, wherein the encoder is configured to load input data into the unresettable circuitry under test; and
 a decoder coupled at an output of the unresettable circuitry under test, wherein the decoder is configured to output the original input data before an emulated power loss and is further configured to effectively corrupt data signals upon readout after the emulated power loss, and wherein the corrupted data signals is not equal to the original input data.

17. The circuit emulation system of claim 16, further comprising a pseudorandom number generator for adjusting the encoder and decoder.

18. The circuit emulation system of claim 16, wherein the unresettable circuitry under test comprises a storage circuit selected from the group consisting of: static random-access memory (SRAM), register files, buffers, and first-in first-out (FIFO) circuits.

19. The circuit emulation system of claim 16, wherein the encoder and decoder are implemented using a plurality of logic exclusive-OR (XOR) gates.

20. The circuit emulation system of claim 16, wherein the decoder is further configured to corrupt the data signals upon readout even after power has been regained following the emulated power loss.

* * * * *